United States Patent [19]

Le Parquier et al.

[11] Patent Number: 4,502,037

[45] Date of Patent: Feb. 26, 1985

[54] ANALOG-DIGITAL OPTICAL CONVERSION PROCESS AND APPARATUS

[75] Inventors: Guy Le Parquier; Claude Puech, both of Paris, France

[73] Assignee: Thomson-CSF, Paris, France

[21] Appl. No.: 392,245

[22] Filed: Jun. 25, 1982

[30] Foreign Application Priority Data

Jun. 26, 1981 [FR] France ................ 81 12614

[51] Int. Cl.³ .......................... H03K 13/02
[52] U.S. Cl. ................ 340/347 AD; 350/96.14
[58] Field of Search ........... 340/347 AD; 350/96.14, 350/96.13, 96.12, 355

[56] References Cited

U.S. PATENT DOCUMENTS 4,058,722 11/1977 Taylor ............... 340/347 AD
4,325,603 4/1982 Marom ............... 340/347 AD

FOREIGN PATENT DOCUMENTS 17571 10/1980 European Pat. Off. .

OTHER PUBLICATIONS

Taylor, "IEEE Journal of Quantum Electronics", vol. QE-15, No. 4, Apr. 1979, pp. 210-216.
Leonberger, "IEEE Trans. on Circuits and Systems", vol. CAS-26, No. 12, Dec. 1979, pp. 1125-1131.
Ahmed, "Applied Optics", vol. 19, No. 18, Sep. 1980, pp. 3050-3051.
Takizawa, "Applied Optics", vol. 18, No. 18, Sep. 1980, pp. 3148-3151.

Primary Examiner—Charles D. Miller
Attorney, Agent, or Firm—Cushman, Darby & Cushman

[57] ABSTRACT

The invention relates to an analog-digital coder incorporating n channels corresponding to the bits of the output word. Each channel comprises at least one light intensity modulator. As a function of the positive or negative half-cycles of the output signal of channel $i+1$, a supplementary phase shift of $+\Delta\Phi$ or $-\Delta\Phi$ is introduced onto the output signal of channel i, with $/\Delta\Phi/ < \pi/2$.

11 Claims, 14 Drawing Figures

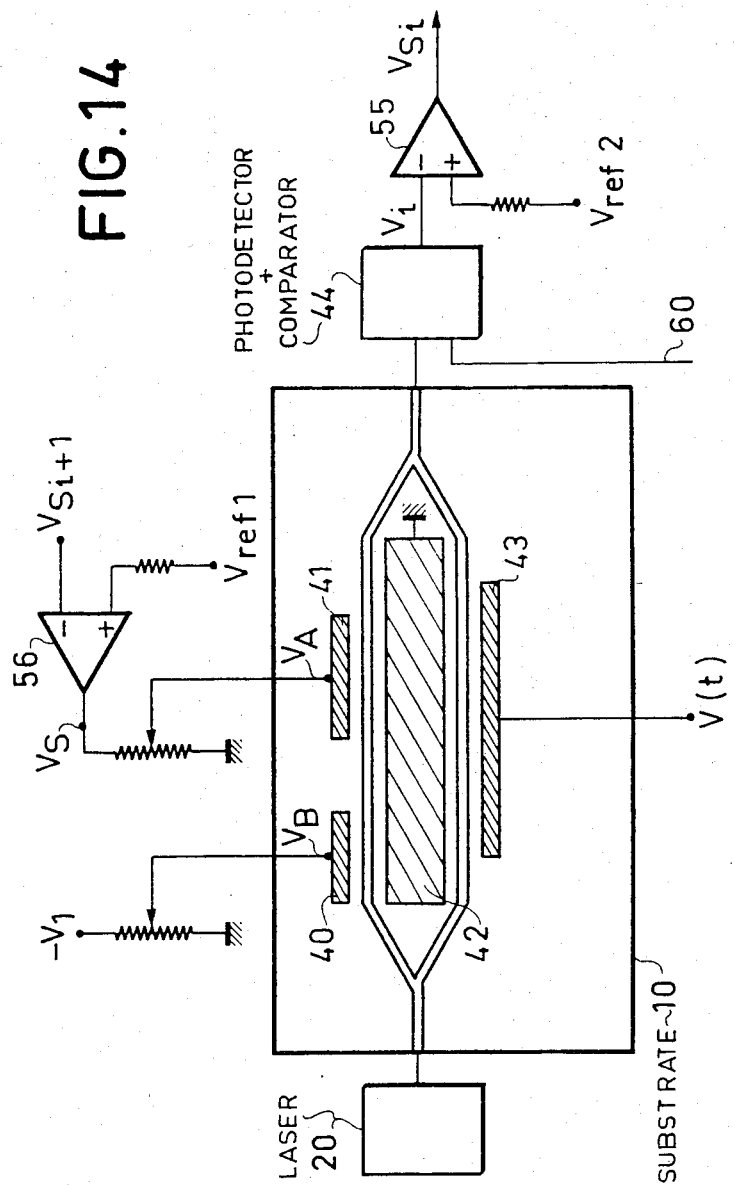

ANALOG-DIGITAL OPTICAL CONVERSION PROCESS AND APPARATUS

BACKGROUND OF THE INVENTION

The present invention relates to an analog-digital optical conversion process and apparatus.

It is known to construct an analog-digital coder by using electronic circuits. However, integrated optics techniques make it possible to carry out signal processing operations with comparable performance levels to those in electronics. Thus, it is known to produce an analog-digital coder using the properties of the integrated optics amplitude modulator. This amplitude modulator is the integrated version of a Mach-Zendler-type two-wave interferometer. In such an interferometer, the light intensity transmitted varies sinusoidally as a function of the phase shift created between the two arms of the interferometer. This phase shift can be obtained by applying a potential difference between electrodes positioned on either side of wavelengths. In such an analog-digital coder, the number of modulators corresponds to the number of bits of the output word. The signal to be digitized is applied to the electrodes respectively corresponding to all these modulators.

On considering a Gray coding system, this imposes the same absolute precision for each transition, so that the relative precision increases in proportion to the significance of the bit of the output word, which can be a dynamics limitation.

BRIEF SUMMARY OF THE INVENTION

The process of the invention, which uses the properties of the integrated optics amplitude modulator does not have this limit.

The present invention therefore relates to an optical analog-digital conversion process in a coder then having n channels corresponding to n bits of the digital output word, each channel having at least one light intensity modulator comprising on the surface of an electrooptical material substrate a two-armed interferometer, the intensity of the emergent radiation being a function of the phase shift introduced by the application of a potential difference between electrodes positioned on the surface of the substrate in the vicinity of at least one of the arms of the interferometer, one of the potential differences representing the signal to be digitized V(t) being applied to all the interferometers at the terminals of electrodes, whose length is such that for the channel $i: L_i = 2^{i-2} L_2$; whereby i can vary from 2 to n and $L_2$ is the length of the electrodes for the channel 2, channel 1 corresponding to the most significant bit 1 of the output word, wherein the output signal of the channel i+1 is positive, a supplementary phase shift $+\Delta\Phi$ is introduced to the output signal of channel i by applying a potential difference to the terminals of electrodes corresponding to at least one of the arms of the modulator corresponding to said channel i and then the output signal of the signal channel i+1 is negative a supplementary phase shift $-\Delta\Phi$ is introduced to the output signal of channel i by applying a potential difference to the terminals of electrodes corresponding to at least one of the arms of the modulator corresponding to said channel i, the phase shift $\Delta\Phi$ being such that: $/\Delta\Phi/ < \pi/2$.

The invention also relates to an apparatus for performing this process.

BRIEF DESCRIPTION OF THE DRAWINGS

The invention is described in greater detail hereinafter relative to non-limitative embodiments and the attached drawings, wherein show:

FIG. 14 a partial circuit diagram of the apparatus according to the invention.

DETAILED DESCRIPTION OF THE PREFERRED EMBODIMENTS

Figure 1:
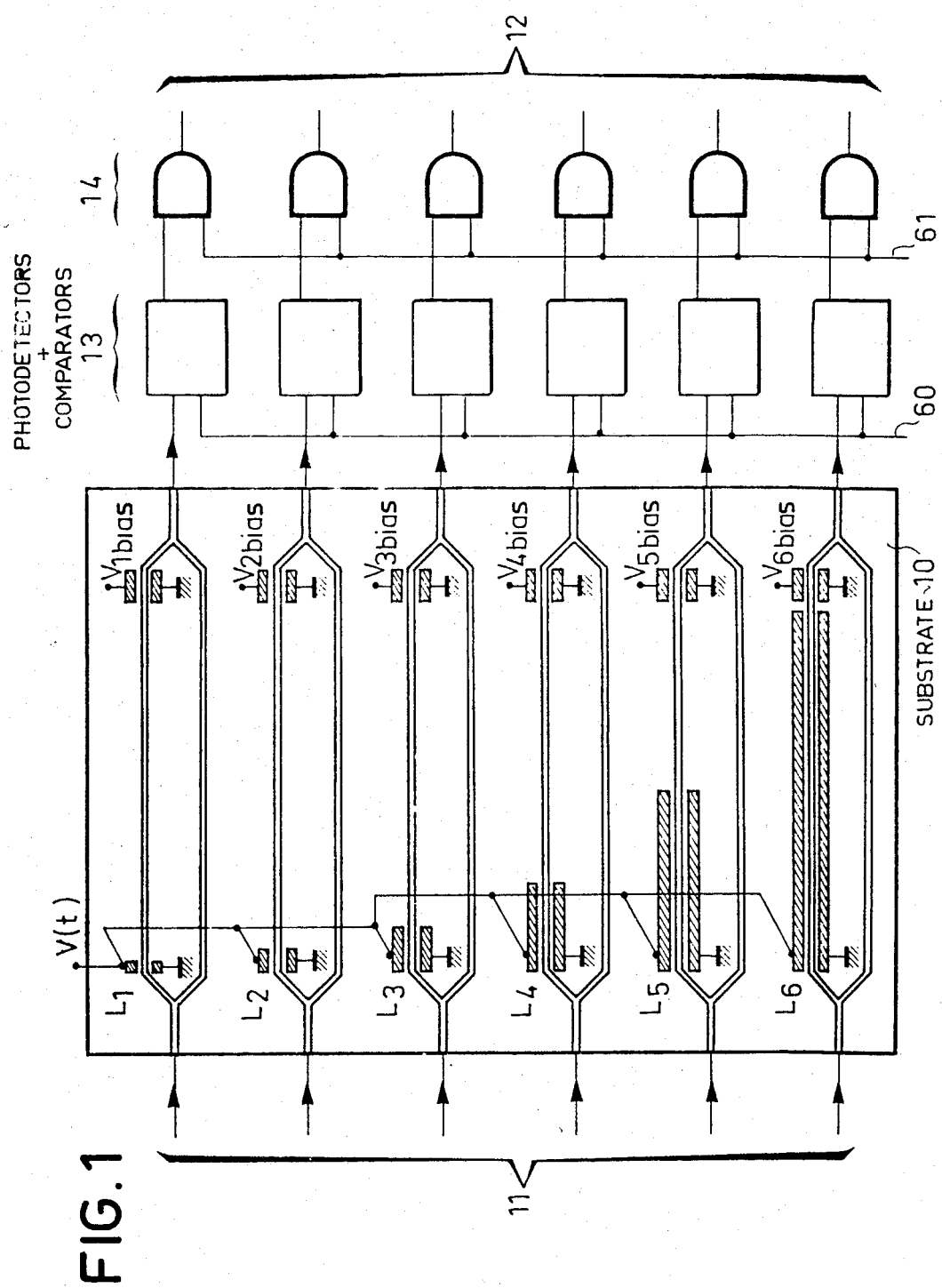
FIG. 1 a prior art analog-digital coder.

The prior art integrated optics analog-digital coder is shown in FIG. 1. It is constructed on the basis of components incorporating a light intensity modulator produced with a two-armed interferometer. A light wave 11 produced by a laser source is supplied to the input of the apparatus having six channels, each of which has an elementary optical modulator integrated onto a substrate 10. Thus, one bit of the output word corresponds to each modulator.

The signal to be digitized V(t) is applied to electrodes belonging to each of the elementary optical modulators, the length of said electrodes differing. There is a length $L_1$ for the modulator of channel 1 and $L_2$, $L_3$, $L_4$, $L_5$ and $L_6$ for the other channels 2, 3, 4, 5 and 6. In this way, it is possible to regulate the phase shift between the two waves arriving in the output guide and consequently the period of the signal $I_S = f(\Delta\Phi')$.

For the pure binary code and the Gray code, consideration is given to the relation $L_i = 2^{i-2} L_2$ with i varying from 2 to N, with N=6 in this case. Thus, the period of the signal representing bit i of the digital output word is double that of the signal representing signal i+1. Channel 1 corresponds to the most significant bit. In the case of the Gray code $L_1 = L_2$, whereas in the case of the pure binary code, $L_2 = 2L_1$.

Consideration can be given to bias voltages, which are called $V_{ibias}$ applied to the modulators of these different channels, said voltages making it possible to introduce a fixed phase shift or bias on one arm.

These different voltages $V_{ibias}$ make it possible to compensate the optical path in the two arms of each elementary optical modulator integrated onto substrate 10. Thus, these optical paths cannot be of strictly equal length as a result of the construction process. Thus, they make it possible to introduce supplementary phase shifts, particularly when the Gray code is used. In this case, the passage from one digital value to the next takes place by modifying a single bit of the digital word, which prevents the risks of multiple transitions. It would also be possible to transmit a signal $V(t) + V_{ibias}$ to a single electrode, each interferometer then only having a single electrode of predetermined length $L_i$.

Photodetectors, followed by comparators represented at 13 are positioned at the output of these modulators and, as a function of the fixed reference values 60, make it possible to obtain at their output values 0 or 1, said fixed reference value 60 representing the maximum intensity divided by 2: $I_{SM}/2$.

At the output, AND gates 14 permit a validation of the output signal at a particular moment. This validation can take account of the transit time in these modulators. When, for example, a pulse laser is used at input 11, this permits sampling in time. Thus, a binary word is obtained in parallel. The response time of such an analog-digital coder has been measured and it is below 0.5 nanoseconds.

In FIG. 1, consideration is given to an electrode of length $L_i$ located on one arm, but it is also possible to apply voltage $V(t)$ to both arms. In this case, the phase shift value is doubled. Thus, to make it unnecessary to lengthen the arms of the modulators at the same time as the electrodes, it is possible to apply a voltage $V(t)$, then $2V(t)$, but there is a voltage limit due to the breakdown voltage which is approximately 40 V for a distance between the electrodes of 4 to 5 micrometers for a guide thickness of approximately 2 micrometers. There is another limit as a result of the difference which must exist between the index of the guide and that of the substrate, so that there is a maximum given value of 30 V.

However, in the apparatus illustrated in FIG. 1 particularly when using a Gray code, the same absolute precision must be obtained for each transition, so that the relative precision increases with the significance of the bit of the digital word, which is a cause of dynamic limitation.

Figure 2:
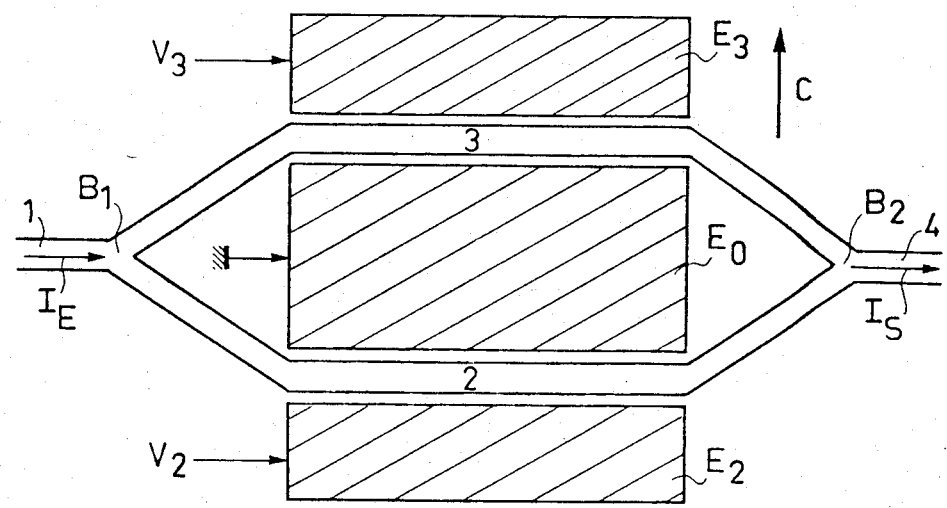
FIGS. 2 and 3 two types of prior art optical modulators.

Consideration will now be given to the signals at the output of the comparators, said signals varying about a zero mean value. FIG. 2 shows the diagram of a two-armed interferometer making it possible to modulate the light intensity $I_E$. This interferometer comprises a monomode input waveguide branch 1 in which is coupled a light wave of intensity $I_E$. Branch 1 is subdivided at junction $B_1$ into two parallel arms 2 and 3 constituting monomode guides, which join again at a junction $B_2$ to form a monomode output waveguide branch 4, where it is possible to recover an intensity $I_S$. The propagation directions in the four guides are the same. In reality, this two-armed interferometer has two outputs. Thus, when the signals are in phase opposition, light propagates within the substrate, leading to the excitation of the higher mode, which instead of propagating in the guide, dissipates into the substrate. Electrodes are positioned on either side of each of the guides 2,3 e.g. a central electrode $E_0$, an electrode $E_2$ on the other side of arm 2 and to which is applied a voltage $V_2$ and an electrode $E_3$ on the other side of arm 3 to which is applied a voltage $V_3$, electrode $E_0$ being connected to earth. The arrangement of the electrodes in the manner shown in FIG. 2, i.e. not overlapping the guides but adjacent thereto, produces in each of the said guides 2 and 3 electrical fields perpendicular to the propagation direction of the waveguides and in the plane of the drawing. In this case, the propagation mode used in the guides is a mode TE. The complete apparatus is produced on the surface of a substrate having electrooptical properties, such as lithium niobate ($LiNbO_3$), lithium tantalate ($LiTaO_3$) or gallium arsenide (GaAs). For example, in a lithium niobate substrate, the optical waveguides are obtained by titanium diffusion, which is selective as a result of conventional photolithography processes. In the case of FIG. 1, where the electrical fields applied to the guides are in the plane of the drawing, it is preferable for the lithium niobate axis c to also be in this plane and perpendicular to the propagation direction common to guides 1 to 4 in such a way as to have the maximum electrooptical effect. If voltages $V_2$ and $V_3$ have the same sign, the fields cause variations in the propagation rates of the light waves for each of the guides, voltage $V_3$ leading to a variation in the reverse direction $-\Delta\beta_2$, which is also proportional thereto. These rate variations lead, at junction $B_2$, to a phase shift between the two waves from guides 2 and 3, which were originally in phase at junction $B_1$. This phase shift $\Delta\Phi'$ is equal to $\Delta\beta_3 L_3 + \Delta\beta_2 L_2$ in which $L_2$ and $L_3$ are the lengths of the electrodes between the two junctions $B_1$ and $B_2$. In general, $L_2 + L_3 = L$, so $\Delta\Phi' = (\Delta\beta_3 + \Delta\beta_2)$. Obviously, one of the two voltages $V_2$ or $V_3$ can be zero, so that only the variation $\Delta\beta_3$ or $\Delta\beta_2$ occurs. The expression of the phase shift $\Delta\Phi'$ can be put into form $$\frac{\pi(V_3 + V_2)}{V_\pi},$$

in which $V_\pi$ is the sum of the voltages leading to a phase shift $\Delta\Phi'$ equal to $\pi$. The light waves recovered in guide 4 result from the combination of the waves from guies 2 and 3 entering junction $B_2$, i.e. two waves of intensity $\alpha(I_E/2)$ having a relative phase shift of $\Delta\Phi'$. Thus, the resultant intensity $I_S$ can be written in the form $$\alpha \frac{I_E}{2} (1 + M\cos \Delta\phi') = \alpha \frac{I_E}{2} \left[ 1 + M\cos \frac{\pi(V_3 + V_2)}{V_\pi} \right]$$

in which $\alpha$ and $M$ are constants dependent on the coupling losses and the asymmetry of the interferometer. A similar result is obtained with a single pair of electrodes, e.g. $E_0$ and $E_3$, in which case $$\Delta\beta_2 = 0 \text{ and } I_S = \alpha \frac{I_e}{2} \left( 1 + M\cos \frac{\pi V_3}{V_\pi} \right).$$

Figure 3:
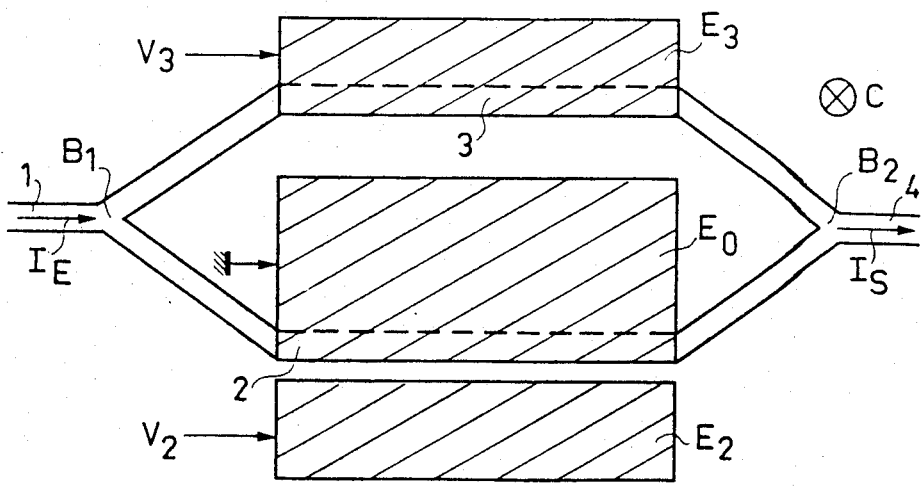

FIG. 3 is also a diagram of a two-armed interferometer, but on this occasion electrodes $E_3$ and $E_0$ are deposited on the surface of the substrate above the two guides 2 and 3. In each of these guides 2 and 3, the arrangement of these electrodes causes fields perpendicular to the propagation of the light waves and perpendicular to the plane of the drawing. It is then preferable for the lithium niobate axis C to be perpendicular to the propagation direction common to guides 1 to 4 and perpendicular to the plane of the drawing.

Figure 4:
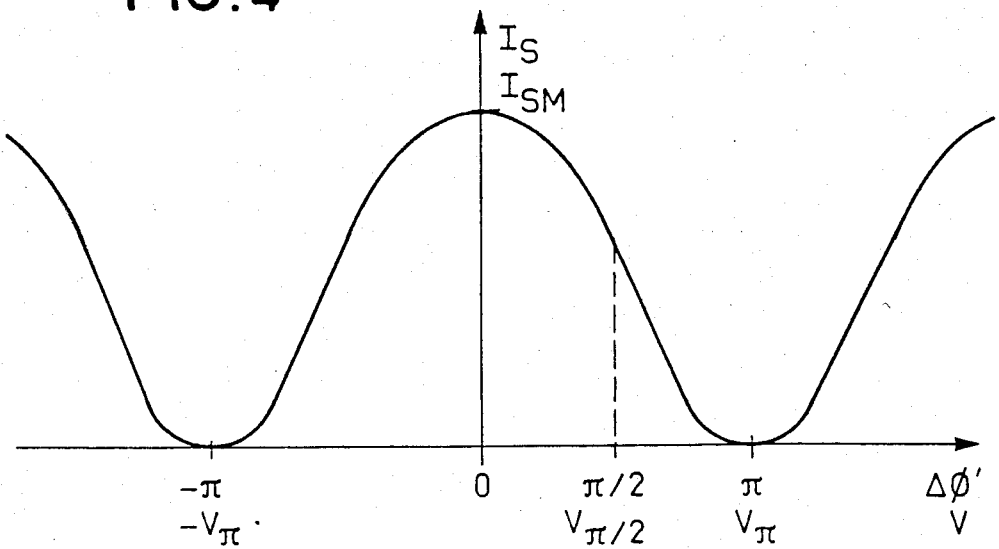
FIG. 4 a graph illustrating the operation of the modulators of FIGS. 2 and 3.

FIG. 4 is the curve representing the emergent intensity $I_S$ relative to the two types of interferometer shown in FIGS. 2 and 3, as a function of the phase shift $\Delta\Phi'$ at junction $B_2$ or voltage $V$ equal to the voltage (or the sum of the voltages) applied to at least one of the electrodes $E_2$ and $E_3$ with their sign relative to earth. When $V$ is zero, the output intensity $I_S$ is maximum and is equal to $I_{SM}$. When the absolute value of $V$ increases, the light intensity $I_S$ decreases and the minimum value $I_m$ is obtained for $V = V_{90}$, said value $I_m$ being theoretically zero, as shown in FIG. 4. In the vicinity of $V\pi/2$, the variation of $I_S$ can be considered, in the first order, as linear as a function of $\Delta\Phi'$ or $V$. However, the harmonic content of the variation of $I_S$ as a function of $V - (V\pi/2)$ increases very rapidly on moving away from $(V\pi/2)$.

Hereinafter, consideration will be given to interferometers of the type illustrated in FIG. 2, but it is also possible to consider interferometers of the type illustrated in FIG. 3.

Electrodes 2 and 3 can also be subdivided into two parts. Part of the length of each interferometer arm can also be exposed to a modulating field obtained from a first voltage $V_M$, whilst the other part is exposed to a modulating field from a second voltage $V_R$. It is interferometers of this type which are considered in FIG. 1.

Through the application of electrical fields of the same intensity and opposite directions to the two arms 2 and 3 of the interferometer, the sensitivity of the modulator is increased, i.e. the modulating voltages necessary for obtaining a given phase shift are reduced.

The invention relates to an analog-digital coder of the same structure as that illustrated in FIG. 1 and which uses as the basic component the integrated optical amplitude modulator like that described hereinbefore. However, the process used makes it possible to obviate the aforementioned problem, i.e. it removes ambiguity.

Figure 5:
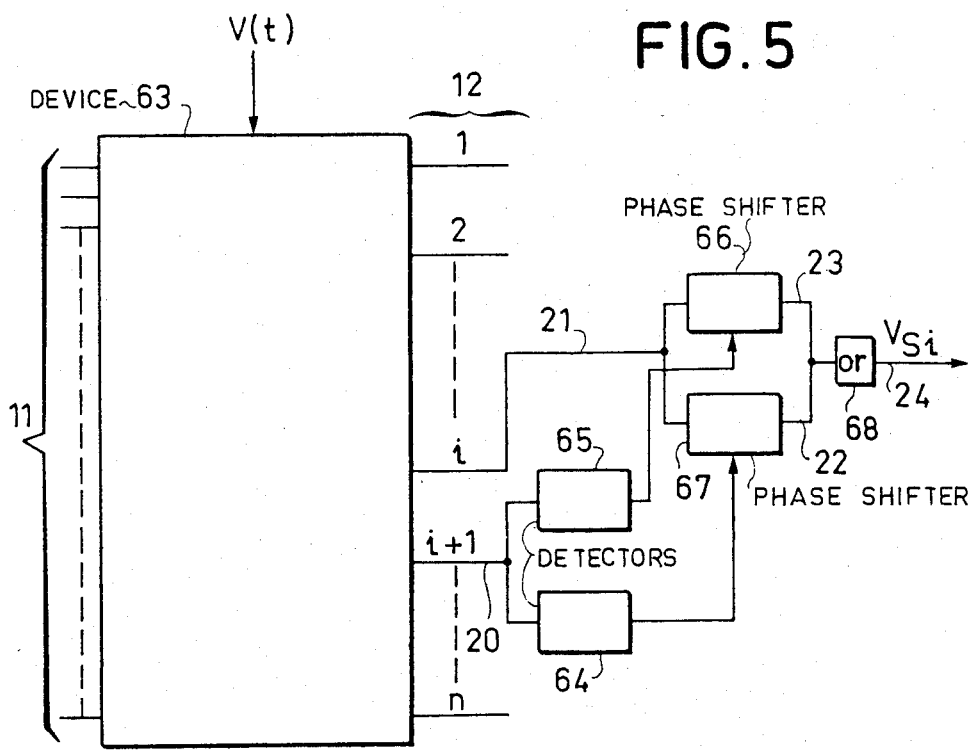
FIG. 5 the apparatus according to the invention.

The apparatus making it possible to use the process of the invention is illustrated in FIG. 5. Thus, consideration will be given to modulators corresponding to significance $2^{-i}$ and $2^{-(i+1)}$, with i between 1 and n.

Figure 6:
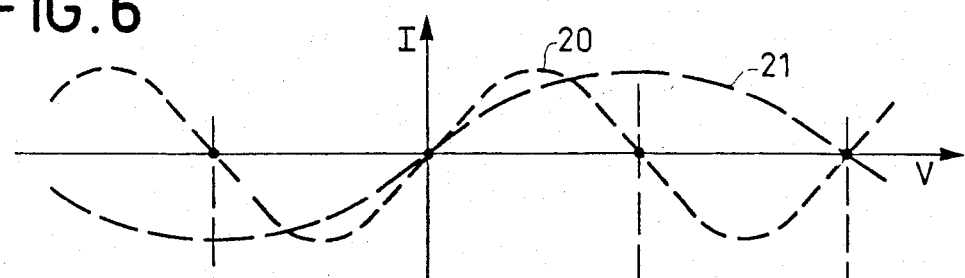
FIGS. 6 to 9 graphs illustrating the operation of the apparatus according to the invention.

In the prior art apparatus, the corresponding output signals simultaneously pass through zero one out of every two occasions, as shown in FIG. 6. In order that there is no error on the bit i, it is necessary to ensure that the precision on zero passage and the gain of the associated amplifier are twice as high as for the bit i+1. This is disadvantageous for the speed, the number of bits of the output word of the coder and the manufacturing tolerances.

Figure 7:
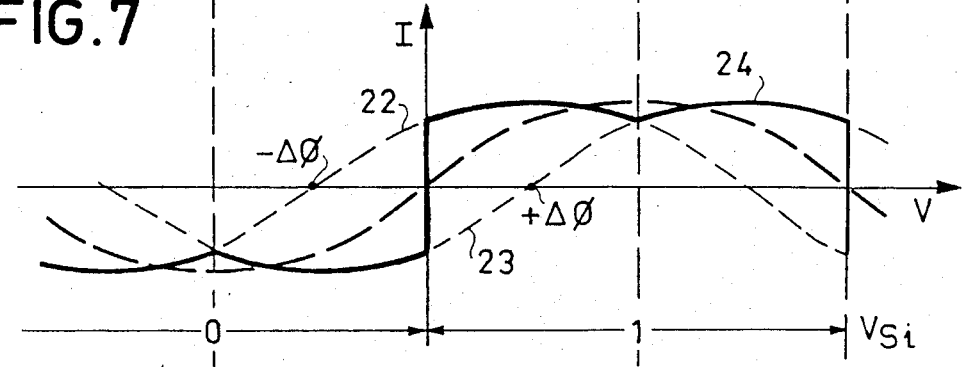

To obviate this problem, the process illustrated in FIG. 7 is used, while considering the circuits of FIG. 5 of apparatus 63 according to the invention. When signal 20 corresponding to bit i+1 is positive, which is detected at 64, the zero passages of signal 21 corresponding to bit i are disposed, by phase shifter 67, by introducing a phase shift $+\Delta\Phi$, which can be e.g. $+\pi/4$. A new signal corresponding to bit i is obtained, i.e. the signal is 22.

When the signal 20 corresponding to bit i+1 is negative, which is detected at 65, the zero passages of signal 21 corresponding to bit i are displaced, by phase shifter 66, by introducing a supplementary phase shift $-\Delta\Phi$ e.g. of $-\pi/4$. A new signal is obtained corresponding to bit i, i.e. this signal is 23. The supplementary phase shift $\Delta\Phi$ is such that $/\Delta\Phi/<\pi/2$.

Thus, signal 21 corresponding to the bit is replaced at the output by the resultant signal 24 in thick lines in FIG. 7. This signal is formed by the parts of signal 22 and signal 23, as described hereinbefore, following as OR gate 68.

Thus, the uncertainties regarding the switching levels are removed, because signal 20 corresponding to bit i+1 is imposed.

Thus, it is clear that the successive positive half-cycles of signal 20 corresponding to bit i+1 are in phase with the positive and then negative half-cycles of signal 22, which is part of the resultant signal 24 in thick lines. In the same way, the successive negative half-cycles of the signal corresponding to bit i+1 are in phase or in phase opposition with the positive or negative half-cycles of signal 23, which is part of the resultant signal 24 in thick lines. This procedure makes it possible to force the decision.

Figure 8:
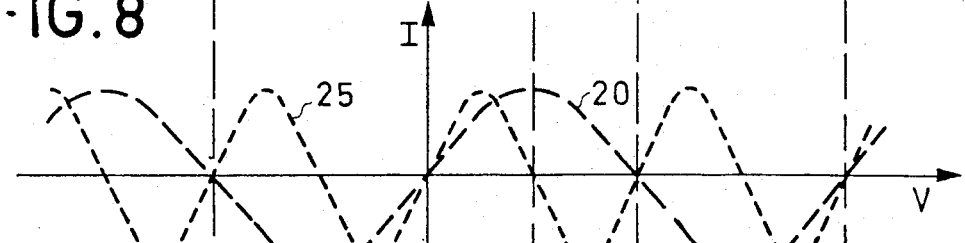
Figure 9:
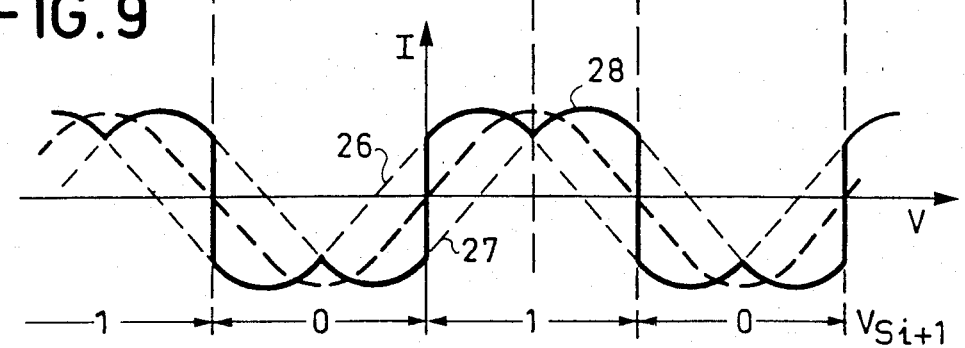

The same procedure is considered with respect to FIGS. 8 and 9, but with the signal corresponding to bits i+1 and i+2 being signals 20 and 25. Signal 26 corresponding to the preceding signal 22 and signal 27 corresponding to the preceding signal 23 are obtained. This makes it possible to obtain the resultant signal 28 in thick lines, which replaces signal 20 at the coder output.

Hereinafter and in general terms, signals 22 or 26 displaced by $-\Delta\Phi$ with respect to the signal representing i or i+1 can be called signal B and signals 23 or 27 displaced by $+\Delta\Phi$, signal A.

Figure 10:
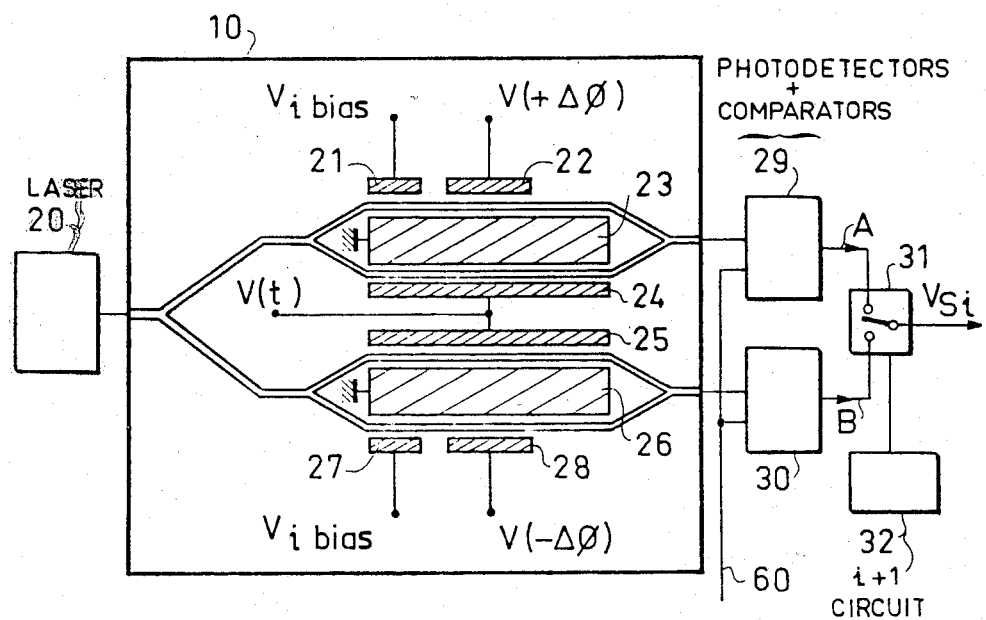
FIGS. 10 to 12 part of the apparatus according to the invention.

Several different embodiments of the integrated optical circuit corresponding to one bit of the output word can be envisaged. The basic component remains the optical amplitude modulator integrated onto the electrodes from which is applied the signal to be digitized, plus a complementary voltage ensuring phase shifts of $+\Delta\Phi$ or $-\Delta\Phi$, $\Delta\Phi$ being equal e.g. to $\pi/4$. As in the case illustrated in FIG. 5, there can also be bias voltages $V_{ibias}$ for compensating differences existing between the optical paths, or for introducing complementary phase shifts, such as that when using the Gray code. A first embodiment is shown in FIG. 10, in which the radiation from laser 20 is simultaneously coupled in two identical modulators. The voltage applied to the electrodes of the first (second) modulator is the voltage to be digitized, plus a voltage ensuring a supplementary phase shift of $+\Delta\Phi$ (or $-\Delta\Phi$). The first modulator produces signal A and the second signal B. Outputs A and B corresponding to the two channels are switched in 31 by a logic signal from stage i+1 represented at 32. A photodetector followed by comparators are represented at 29 and 30.

Figure 11:
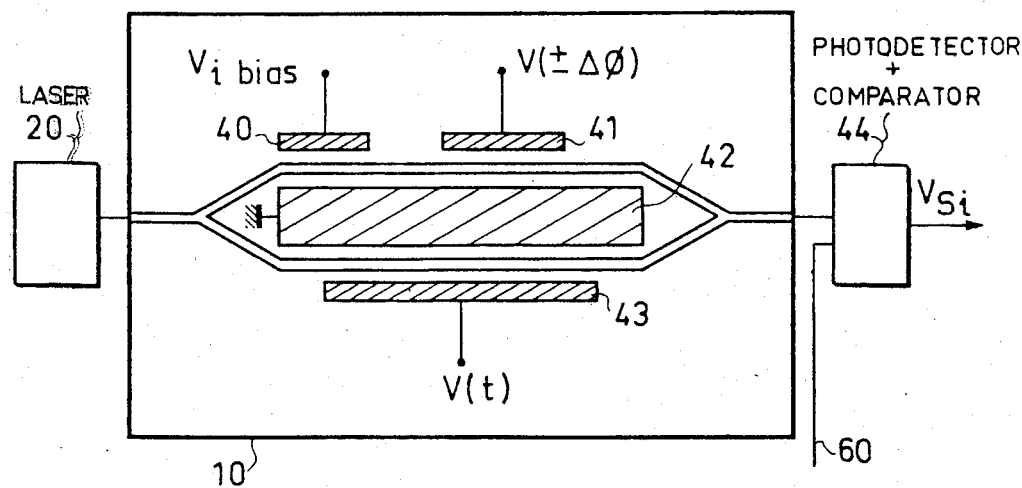

This principle is completely valid for bits of rank i and with i varying from 1 to n, it can be seen that only the precision of the highest rank coder is important, the others only serving to remove ambiguity. A second embodiment illustrated in FIG. 11 consists of using only a single amplitude modulator on the electrodes from which, besides the voltage to be digitized, is applied a voltage ensuring a phase shift of $+\Delta\Phi$ or $-\Delta\Phi$, as a function of the information given by stage i+1, a photodetector followed by a comparator is represented at 44. Thus, in the case of the integrated optical coder, the n bits of the output word are available in parallel.

In this new coder configuration, the different bits are successively known, the most significant bit being known last. Assuming a response time of 1 nanosecond per stage, the fact that the response for bit i makes it necessary to know bit (i+1) means that the total response time is n nanoseconds for a coder with n bits or approximately 6 nanoseconds for a coder of 6 bits of the output word and this transit time is not disadvantageous for most applications.

It is also possible to introduce delay lines into the corresponding logic of these bits, which makes it possible to reestablish e.g. a flow rate of 1 nanosecond per output word, no matter what the number of stages.

Figure 12:
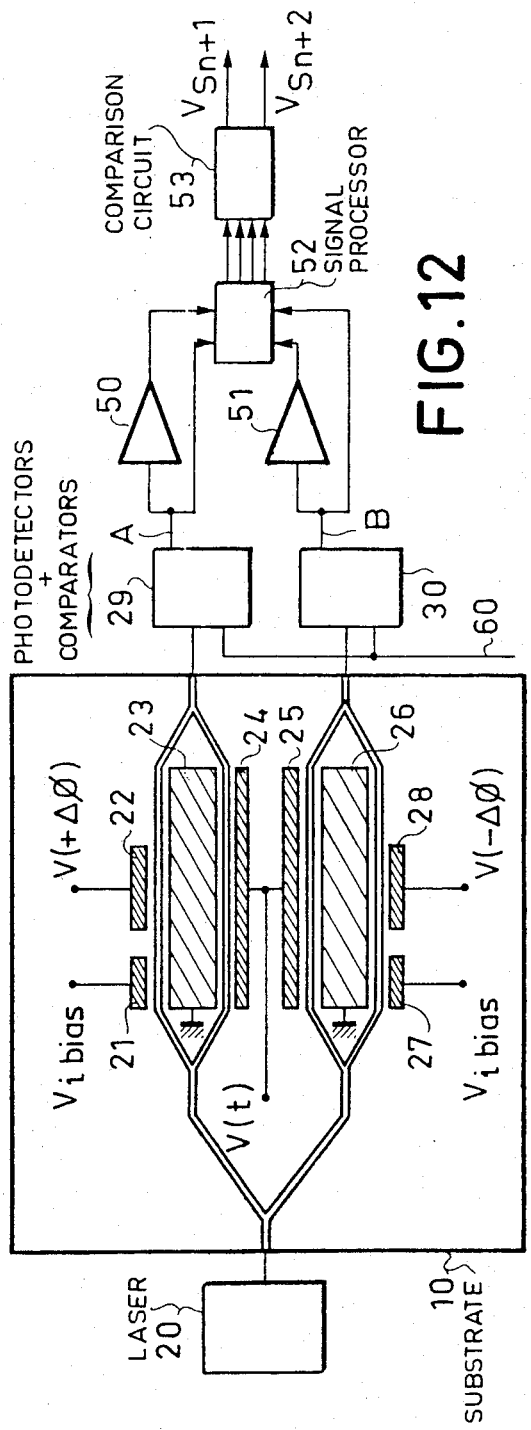
Figure 13:
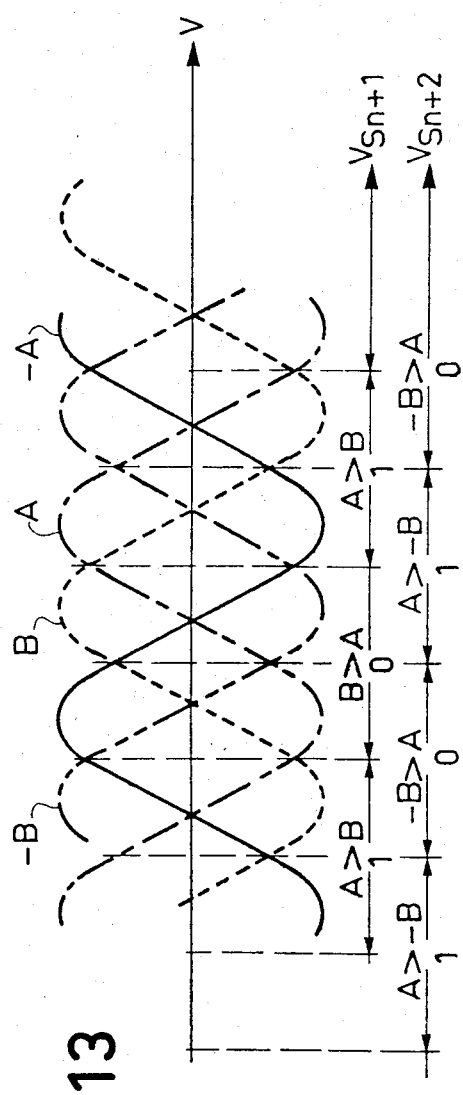
FIG. 13 a graph illustrating the variant of FIG. 11.

A modification of the circuit, corresponding to the least significant bit, is illustrated in FIG. 12 and makes it possible to add two supplementary precision bits. Thus, it is possible to obtain signals A, B, $-A$, $-B$; $-A$ and $-B$ being signals in phase opposition with signals A and B. Supplementary information is obtained from the dial in which the sine curve is located. Two bits of the output word are obtained by code conversion. One of these $S_{n+1}$ corresponds to the comparison of A and B and the other Sn+2 to the comparison of A and −B, as shown in FIG. 13.

FIG. 12 corresponds to FIG. 10, to which certain modifications have been made. Circuits 50 and 51 make it possible to obtain signals −A and −B. At the output of circuit 52 there are signals A, B, −A, −B and at the output of circuit 53 signals corresponding to the two supplementary bits Sn+1 and Sn+2.

FIG. 14 shows a specific embodiment of the apparatus previously described and illustrated in FIG. 10. A voltage $V_B$ introducing a phase shift of $-\Delta\Phi$ is applied to bias electrode 40. Signal $V_{si+1}$ from bit i+1 is either 0 if the bit is 0 or V if the bit is 1. It is passed into a comparator 56 in which is entered a reference voltage $V_{ref1}$.

If $V_{i+1} < V_{ref1}$, $V_s \sim 0 \rightarrow$ the voltage $V_A$ applied to the electrode 41 differs slightly from 0: $V_A \sim 0 \rightarrow$ zero phase shift. If $V_{i+1} > V_{ref1}$, $V_s \neq 0 \rightarrow$ the voltage $V_A$ applied to electrode 41 is such that the phase shift is $2\Delta\Phi$. Thus, if bit i+1 is zero: $V_B + V_A \rightarrow$ phase shift of $-\Delta\Phi$, while if bit i+1 is 1: $V_B + V_A \rightarrow$ phase shift of $+\Delta\Phi$.

The detection electronics placed at the guide output comprises a photodetector followed by an amplifier represented at 44 so as to adjust voltage $V_i$ and a comparator 55. Voltage $V_i$ from the amplifier is compared with a reference voltage $V_{ref2}$:

If $V_i < V_{ref2} \rightarrow V_i = 0$

If $V_i > V_{ref2} \rightarrow V_i = 1$.

What is claimed is:

1. An optical analog/digital conversion process in a coder having n channels corresponding to n bits of a digital output word, each channel having at least one light intensity modulator comprising an electrooptical material substrate having a two-armed interferometer on a surface thereof, the intensity of emergent radiation being a function of a phase shift introduced by application of a potential between electrodes positioned on the surface of the substrate in the vicinity of at least one of the arms of the interferometer, said process comprising the steps of:
    applying the signal V(t) to be digitized, to all the interferometers at said electrodes whose length is such that $L_j = 2^{j-2} L_2$, wherein j varies from 2 to n and $L_2$ is the length of said electrodes for the channel 2, channel 1 corresponding to the most significant bit 1 of the output word;
    determining whether the output signal of the channel i+1 is positive or negative, wherein i varies between 1 and n;
    supplying a supplementary phase shift $+\Delta\Phi$ to the output signal of the channel i by applying a potential difference to said electrodes corresponding to at least one of the arms of the channel i modulator when said determining steps determines the output signal of the channel i+1 to be positive, the phase shift being such that $|\Delta\Phi| \leq \pi/2$; and
    supplying a supplementary phase shift $-\Delta\Phi$ to the output signal of the channel by applying a potential difference to said electrodes corresponding to at least one of the arms of the channel i modulator when said determining step determines the output signal of the channel i+1 to be negative, the phase shift being such that $|\Delta\Phi| \leq \pi/2$.

2. An optical analog-digital converter apparatus, comprising:
    a coder including: (1) n channels corresponding to n bits of a digital output word; (2) n light intensity modulators, each having an electrooptical material substrate on which a two-armed interferometer is arranged, wherein each one of said n light intensity modulators corresponds to one of said n channels; and (3) at least two electrodes arranged on each of said substrates of said n light intensity modulators in the vicinity of at least one of said interferometer arms, wherein a potential difference representing a signal V(t) to be digitized is applied to all the interferometers at said electrodes whose length L is such that, $L_j = 2^{j-2}$, where j varies from 2 to n and $L_2$ is the length of the electrodes for the channel 2, channel 1 corresponding to the most significant bit 1 of the digital output word;
    means for detecting the positive and negative half-cycles of output signals from each of said n channels of said coder;
    phase shifting means for producing a phase shift $+\Delta\Phi$ on the output signal of an ith channel of said n channels in response to said detecting means detecting a positive half-cycle output signal from an i+1 channel of said n channels and for producing a phase shift $-\Delta\Phi$ on the output signal of said ith channel of said n channels in response to said detecting means detecting a negative half-cycle output signal from said i+1 channel of said n channels, wherein i varies between 1 and n and the digital output word is output in Gray code form.

3. An apparatus according to claim 2, wherein for the least significant channel n, two new output bits are generated by comparing the output signal displaced by $+\Delta\Phi$ with the output signal displaced by $-\Delta\Phi$ and with their signals in phase opposition.

4. An apparatus according to claim 2, wherein the two-armed interferometer is arranged on a surface of the substrate and is comprised of zones in which the refractive index is above that of the substrate.

5. An apparatus according to claim 4, wherein the substrate comprises lithium niobate, the two-armed interferometer being comprised of titanium which is locally diffused on the substrate.

6. An apparatus according to claim 4, wherein the substrate is oriented in such a way that its axis C is parallel to the electrical fields produced in the arms of the interferometer.

7. An apparatus according to claim 2, having first, second and third electrodes arranged on each of said substrates, the potential difference being respectively applied to the two arms of the interferometer and between said first and second electrodes and said first and third electrodes, said three electrodes being arranged in such a way that voltages having the same polarity and applied respectively to the second and third electrodes in common with the first electrode produce in the two arms electrical fields of opposite directions.

8. An apparatus according to claim 7, wherein the three electrodes are arranged so as to be adjacent to the arms of the interferometer, the first being placed on either side of the interferometer, so as to create in the arms electrical fields parallel to the surface of the substrate.

9. An apparatus according to claim 7, wherein the first electrode is placed between the two arms so as to selectively cover one of the arms, the second electrode being positioned so as to be adjacent to said arm, the third electrode being positioned so as to cover the other arm, in such a way as to produce in the guides electrical fields perpendicular to the surface of the substrates.

10. An optical analog-digital converter apparatus, comprising:
a coder including: (1) n channels corresponding to n bits of a digital output word; (2) 2 n light intensity modulators, each having an electrooptical material substrate on which a two-armed interferometer is arranged, wherein each two of said 2 n light intensity modulators corresponds to one of said n channels; and (3) at least two electrodes arranged on each of said substrates of said n light intensity modulators in the vicinity of at least one of said interferometer arms, wherein a potential difference representing a signal V(t) to be digitized is applied to all the interferometers;
means for detecting the positive and negative half-cycles of output signals from each of said 2 n modulators, said detecting means comprising a detector followed by a comparator, coupled to each of said 2 n modulators;
means for applying another potential difference to one of the two arms of each interferometer so as to successively produce a phase shift of $+\Delta\Phi$ and $-\Delta\Phi$; and
2 n switches for selecting the output signal from only one of said comparators, corresponding to said each two of said 2 n light intensity modulators, of an ith channel of said n channels in response to said detecting means detecting a positive half-cycle output signal or a negative half-cycle output signal from said i+1 channel of said n channels, wherein the signal representing the channel i+1 has significance immediately below that of channel i, i varies between 1 and n and the digital output word is output in Gray code form.

11. An optical analog-digital converter apparatus, comprising:
a coder including: (1) n channels corresponding to n bits of a digital output word; (2) n light intensity modulators, each having an electrooptical material substrate on which a two-armed interferometer is arranged, wherein each one of said n light intensity modulators corresponds to one of said n channels; and (3) at least two electrodes arranged on each of said substrates of said n light intensity modulators in the vicinity of at least one of said interferometer arms, wherein a potential difference representing a signal V(t) to be digitized is applied to all the interferometers;
means for detecting the positive and negative half-cycles of output signals from each of said n channels of said coder, said detecting means comprising a photodetector followed by a comparator, coupled to each of said n channels; and
means for applying another potential difference to one of the two arms of each interferometer so as to successively produce a phase shift of $+\Delta\Phi$ and $-\Delta\Phi$ as a function of the positive or negative half-cycles of a signal representing an i+1 channel of said n channels whose significance is immediately below that of an ith channel, wherein i varies between 1 and n and the digital output word is output in Gray code form.

* * * * *